United States Patent [19]

Maeno et al.

[11] Patent Number: 4,813,043
[45] Date of Patent: Mar. 14, 1989

[54] SEMICONDUCTOR TEST DEVICE

[75] Inventors: Hideshi Maeno; Tetsuo Tada, both of Itami, Japan

[73] Assignee: Mitsubishi Denki Kabushiki Kaisha, Tokyo, Japan

[21] Appl. No.: 17,079

[22] Filed: Feb. 20, 1987

[30] Foreign Application Priority Data

Feb. 21, 1986 [JP] Japan .................... 61-37745

[51] Int. Cl.$^4$ .......................... G01R 31/28
[52] U.S. Cl. ......................... 371/27; 371/21
[58] Field of Search ................ 371/21, 27, 25, 16, 371/18, 20

[56] References Cited

U.S. PATENT DOCUMENTS

| | | | |
|---|---|---|---|
| 4,555,663 | 11/1985 | Shimizu | 371/27 |
| 4,586,181 | 4/1986 | Shimizu | 371/27 |
| 4,670,879 | 6/1987 | Okino | 371/27 |
| 4,692,920 | 9/1987 | Tannhocuser | 371/21 |
| 4,701,919 | 10/1987 | Naitoh | 371/21 |

OTHER PUBLICATIONS

"Self-Testing by Polynomial Division" by Dilip K. Bhavsar and Richard W. Heckelman, General Electric Company, Electronics Laboratory, 1981 IEEE Test Conference, Paper 9.2.

Primary Examiner—Michael R. Fleming
Attorney, Agent, or Firm—Birch, Stewart, Kolasch & Birch

[57] ABSTRACT

A semiconductor test device including a function test algorithmic pattern generator which comprises: an ALU unit with shift-in function for conducting a predetermined arithmetical and logical operation against the base data or the output of an ALU output register; the ALU output register being designed to store the output of the ALU and output a function test algorithmic pattern; and a parity detection circuit which conducts a parity detection against an arbitrary group of bits of the ALU output register, and the detection output is input into a shift-in input of the ALU.

3 Claims, 3 Drawing Sheets

| clock cycle | Q3 | Q2 | Q1 | Q0 | decimal representation |
|---|---|---|---|---|---|
| 0 | 1 | 0 | 0 | 0 | 8 |
| 1 | 1 | 1 | 0 | 0 | 12 |
| 2 | 1 | 1 | 1 | 0 | 14 |
| 3 | 1 | 1 | 1 | 1 | 15 |
| 4 | 0 | 1 | 1 | 1 | 7 |
| 14 | 0 | 0 | 0 | 1 | 1 |
| 15 | 1 | 0 | 0 | 0 | 8 |

4,813,043

SEMICONDUCTOR TEST DEVICE

FIELD OF THE INVENTION

The present invention relates to a semiconductor test device, and more particularly to an improvement in a function test algorithmic pattern generator.

BACKGROUND ART

FIG. 4 is a block diagram showing a function test algorithmic pattern generator of a prior art semiconductor test device. In FIG. 4, the reference numeral 1 designates a base data register for storing reference data. The reference numeral 2 designates a constant register for storing a constant to be used in the constant operation. The reference numeral 3a designates an arithmetical and logical operation unit for conducting various arithmetical and logical operations. The reference numeral 4 designates a selector for selecting the input of the ALU 3a. The reference numeral 5 designates an ALU output register for storing the operation result of the ALU 3a.

The device will be operated as follows.

When the output of the base data register 1 is selected by the selector 4, this output is provided as input to the ALU 3a, and is subjected to arithmetical and logical operation with using a constant which is supplied from the constant register 2. The operation result is stored at the ALU output register 5. On the other hand, when the output of-the ALU output register 5 is selected by the selector 4, that output is subjected to the above-described arithmetical and logical operation using the constant from the constant register 2, and the operation result is stored at the ALU output register 5. Thus, the content of the ALU output register 5 is renewed successively.

In the prior art algorithmic pattern generator with such a construction, arithmetical and logical operations which can be executed in the ALU are limited to those such as addition, subtraction, shifting, inversion, AND, and OR. This requires many types of fundamental operations to generate a complicated pattern such as a pseudo-random number sequence, which results in an incapability in conducting a high speed test.

SUMMARY OF THE INVENTION

An object of the present invention is to provide an improved semiconductor test device capable of generating even complicated function test patterns such as pseudo-random numbers at a high speed.

Other objects and advantages of the present invention will become apparent from the detailed description given hereinafter. It should be understood, however, that the detailed description and specific embodiment are given by way of illustration only, since various changes and modifications within the spirit and scope of the invention will become apparent to those skilled in the art from this detailed description.

According to the present invention, there is provided a semiconductor test device including a function test algorithmic pattern generator which comprises: an ALU unit with shift-in function for conducting a predetermined arithmetical and logical operation against base data or the output of an ALU output register; said ALU output register being designed to store the output of said ALU and output a function test algorithmic pattern; and a parity detection circuit which conducts a parity detection against an arbitrary group of bits of said ALU output register, and the detection result is input into a shift-in input of said ALU.

DETAILED DESCRIPTION OF THE PREFERRED EMBODIMENTS

Figure 1:
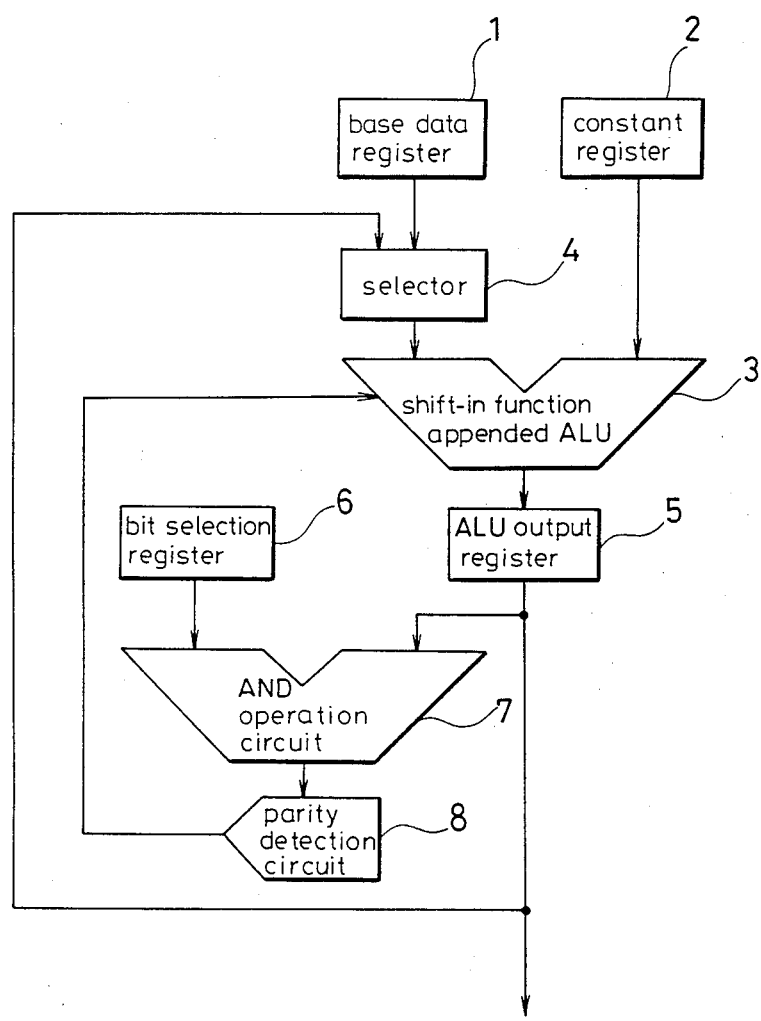
FIG. 1 is a block diagram showing a function test algorithmic pattern generator of a semiconductor test device as an embodiment of the present invention.

In order to explain the present invention in detail, reference will be particularly made to FIG. 1.

Figure 4:
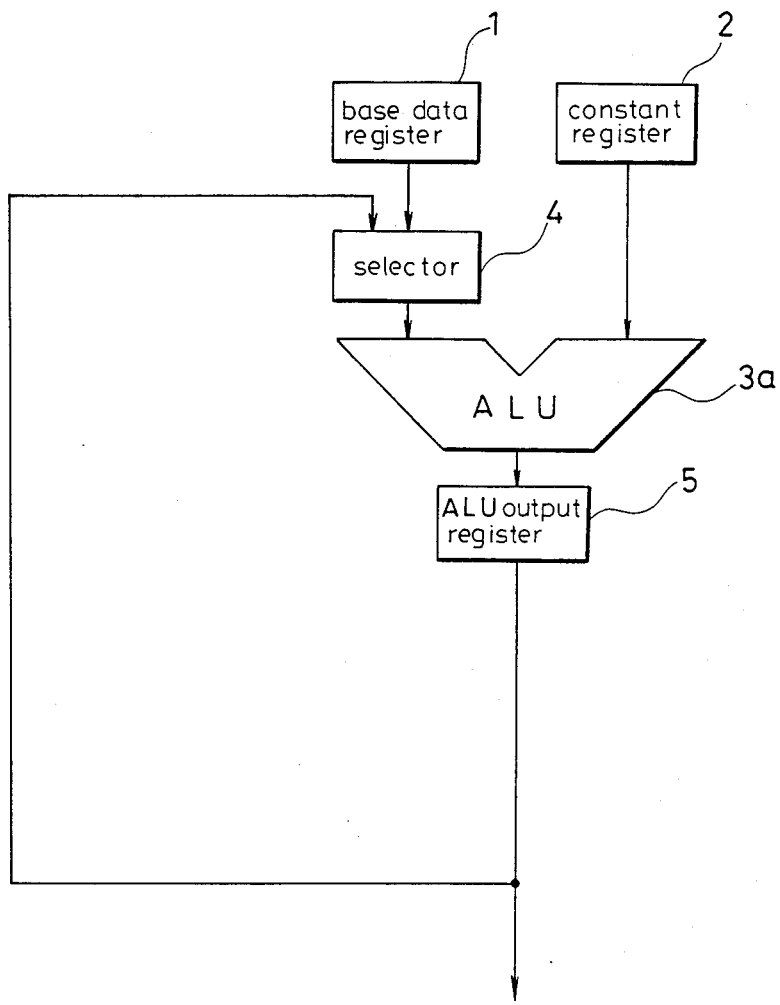
FIG. 4 is a block diagram showing a prior art function test algorithmic pattern generator.

The reference numerals 1, 2, and 4 designate respectively, a base data register, a constant register, and a selector which are the same as those shown in FIG. 4. The reference numeral 3 designates a shift-in function appended ALU which is constructed by providing a shift-in function with the ALU 3a of FIG. 4. The reference, numeral 6 designates a bit selection register. The reference numeral 7 designates an AND operation circuit. The reference numeral 8 designates a parity detection circuit.

The device will be operated as follows.

The content of the ALU output register 5 is input to the AND operation circuit 7, and is provided as subjected to an AND operation with the content of the bit selection register 6. The AND operation result is sent to the parity detection circuit 8, and a parity detection is conducted. The parity detection result is supplied to the shift-in input of the ALU 3.

When a pseudo-random number is to be generated, an appropriate value is set at the bit selection register 6 so as to make a desired bit of the output of the ALU output register 5 be supplied to the parity detection circuit 8. The shift-in function appended ALU 3 is set under the shift operation state, and the selector 4 is switched at the side of the ALU output register 5. When the algorithmic pattern generator is operated in this state, the content of the ALU output register 5 is successively shifted, and the detection result of the parity detection circuit 8 is used as the shift-in bit of this shift operation.

Figures 2, 3:
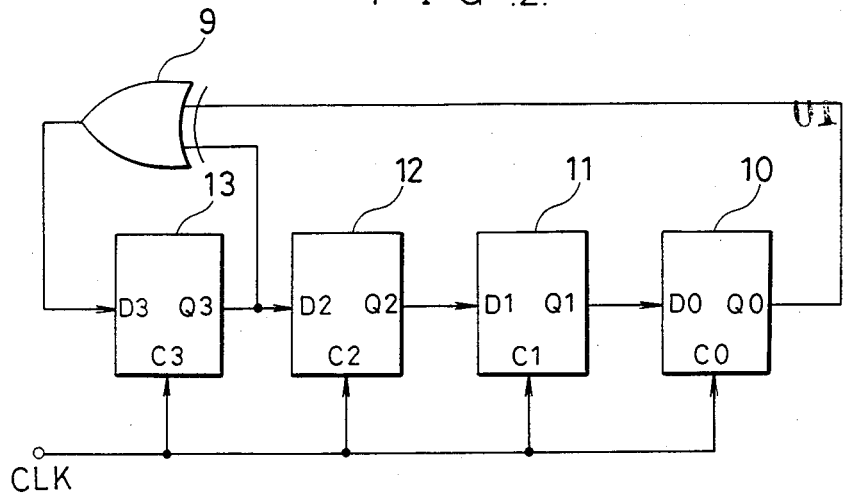
FIG. 2 is a circuit diagram showing an example of a pseudo-random number generator.
FIG. 3 is a diagram showing an operation result of the pseudo-random number generator of FIG. 2.

The above-described operation is equivalent to the algorithm of the pseudo-random number generator as seen from the following description with reference to FIGS. 2 and 3.

FIG. 2 shows a circuit of a 4 bit pseudo-random number generator. In FIG. 2, the reference numeral 9 designates an exclusive OR circuit, and the reference numerals 10, 11, 12, and 13 designate flip-flop circuits. The exclusive OR circuit 9 corresponds to the parity detection circuit 8 of FIG. 1, and the flip-flop circuits 10, 11, 12, and 13 correspond to the ALU output register 5 of FIG. 1. The connections of the outputs of the flip-flop circuits 13 and 10 to the inputs of the exclusive OR circuit 9 in the device of FIG. 2 which corresponds to "1001" (binary number), is established at the bit selection register 6 in the device of FIG. 1.

In FIG. 2, the respective flip-flop circuits 10 to 13 conduct shift operations to the next stage at each time when the clock CLK is input thereto respectively. The parity detection result for the contents of the flip-flops is stored into the flip-flop circuit 13 as the shift bit of the flip-flop connection.

FIG. 3 displays a table which shows the output of this circuit wherein the device operation starts from the state where the initial values Q3, Q2, Q1, and Q0 at clock cycle 0 are 1, 0, 0, and 0, respectively. The random number is renewed at every clock cycle, and it returns to the same number at every 15th clock cycle as seen from the fact that the number at the clock cycle 15 is the same as that at the clock cycle 0. This generated random number is called a pseudo-random number because this is not a real random number, since it repeats the same output sequence at some cycle.

In the block construction shown in FIG. 1, a peeudo-random number generator which corresponds to that shown in FIG. 2 and generates a pseudo-random number at a high speed, can be constituted arbitrarily. This enables the conducting of a function test of a semiconductor device at a high speed while also reducing the test cost.

In the illustrated embodiment, only the shift operation is described as an operation possessed by the shift-in function appended ALU 3, but it is possible to generate a further complicated pattern at a high speed by using the parity detection result as a carry bit or borrow bit for the operation of addition or subtraction.

As is evident from the foregoing description, according to the present invention, a parity detection is conducted against an arbitrary group of bits of the ALU output register. The detection result is shifted-in into the ALU, whereby a complicated pattern such as a pseudo-random number sequence can be generated at a high speed, and the test of a semiconductor device can be executed at a high speed relative to a conventional device.

What is claimed is:

1. A test device for generating algorithmic test patterns comprising:
   an ALU unit with shift-in means for generating and storing algorithmic test patterns by conducting predetermined arithmetic and logic operations on input data to said ALU unit;
   parity detection means for generating a parity detection bit from selected parity bits of said algorithmic test patterns generated by said ALU unit, said parity detection bit is input into said ALU unit for providing said shift-in means; and
   selection means for selecting between input reference data and said algorithmic test patterns from said ALU unit, said selecting means provides said input data to said ALU unit.

2. The test device of claim 1, wherein said ALU unit comprises ALU means for generating said algorithmic test patterns and an output register for storing and outputting said algoriithmic test patterns.

3. The test device of claim 1, wherein said parity detection means comprises:
   bit selection means for selecting said selected parity bits; and
   logic operation means for generating said parity detection bit from said selected parity bits and said algorithmic test patterns.

* * * * *